310-322 SR
OR 4,016,436 656

United States Patent [19]
Shoh

[11] 4,016,436
[45] Apr. 5, 1977

[54] SONIC OR ULTRASONIC PROCESSING APPARATUS

[75] Inventor: Andrew Shoh, Ridgefield, Conn.

[73] Assignee: Branson Ultrasonics Corporation, New Canaan, Conn.

[22] Filed: Dec. 10, 1975

[21] Appl. No.: 639,219

[52] U.S. Cl. .................... 310/8.2; 310/8.7

[51] Int. Cl.[2] .................... H01L 41/04

[58] Field of Search .............. 310/8.2, 8.3, 8.7, 9.1, 310/26; 181/.5; 259/1 R, DIG. 15, DIG. 44

[56] References Cited

UNITED STATES PATENTS

| | | | |
|---|---|---|---|
| 2,891,179 | 6/1959 | Elmore | 310/26 |
| 2,891,180 | 6/1959 | Elmore | 310/26 |
| 3,162,368 | 12/1964 | Choate et al. | 310/8.7 |
| 3,173,034 | 3/1965 | Dickey et al. | 310/8.3 |
| 3,184,842 | 5/1965 | Maropis | 310/8.2 X |
| 3,546,498 | 12/1970 | McMaster et al. | 310/8.2 |
| 3,694,675 | 9/1972 | Loveday | 310/8.2 X |
| 3,930,173 | 12/1975 | Banko | 32/DIG. 4 |

*Primary Examiner*—Mark O. Budd
*Attorney, Agent, or Firm*—Ervin B. Steinberg; Philip J. Feig

[57] ABSTRACT

A tubular resonator is coupled coaxially to a half wavelength extensional resonator at a nodal region of the vibratory motion in a direction parallel to the longitudinal axis of the extensional resonator. The frequency of the vibratory motion is in the sonic or ultrasonic frequency range, typically in the range from 1 kHz to 100 kHz. The radially directed vibratory motion at the nodal region of the extensional resonator is coupled to the tubular resonator and is converted by the tubular resonator into radial flexural vibratory motion which motion travels along the wall of the tubular resonator in a direction parallel to the longitudinal axis. A fluid within the flexural resonator thus is subjected to intense vibratory energy.

12 Claims, 6 Drawing Figures

SONIC OR ULTRASONIC PROCESSING APPARATUS

BRIEF SUMMARY OF THE INVENTION

The present invention concerns an improved sonic or ultrasonic processing apparatus specifically adapted for continuous processing applications such as emulsification, atomization, dispersion, cleaning and tinning. More particularly, the invention discloses a sonic or ultrasonic apparatus having regions characterized by increased sonic or ultrasonic energy intensity.

The apparatus forming the present invention comprises generally, an electroacoustic converter electrically connected to a high frequency electrical energy generator which when providing electrical energy of predetermined frequency, typically in the high frequency range between 1 kHz and 100 kHz, causes the electroacoustic converter to transform the applied electrical energy into mechanical vibratory energy. An extensional resonator is coupled to the converter at an antinodial region of vibratory motion traveling along the longitudinal axis of the converter for receiving the vibratory energy.

A tubular flexural resonator is disposed coaxially about the extensional resonator and is in forced engagement with a coupling flange disposed circumferentially around the extensional resonator at a nodal region of the vibratory motion, whereat the extensional resonator exhibits substantially all of its vibratory motion in the radial direction. The flexural resonator responsive to the radial motion of the extensional resonator coupled thereto undergoes radial flexural vibration, such vibration being propagated along the wall of the flexural resonator in a direction parallel to the longitudinal axis. The flexural resonator is constructed of a material which is suitable for transmitting vibratory energy in the sonic or ultrasonic frequency range, such as aluminum, titanium, steel or ceramic. The choice of a material for a particular apparatus and application depends upon the nature of the liquid contained within the resonator, i.e. corrosive or non-corrosive, and the required amplitude of the radial flexural waves traveling along the wall of the resonator.

The amplitude of the flexural waves is affected by the length, wall thickness and attenuation characteristics of the flexural resonator. Since the amplitude of the flexural waves is reduced as the waves travel along the length of the tube acting as a flexural resonator due to the attenuation characteristic of the resonator material, the maximum length of the tube is limited to a length which provides sufficient flexural amplitude for causing fluid contained within the tube to be agitated near the free end of the flexural resonator. Best results are obtained when the length of the flexural resonator is greater than its radius.

The apparatus is also capable of intensifying the vibratory energy within the tubular resonator at predetermined locations by decreasing the wall thickness of the tube at selected nodal regions along the length of the tube. A fluid medium flowing through the tubular flexural resonator so dimensioned is thus subjected to regions of increased ultrasonic energy intensity. Moreover, the present invention provides an apparatus characterized by a simpler and more economical apparatus than that disclosed by the prior art.

In a modification of the invention, the tubular flexural resonator can be used as a processing tank into which a workpiece is placed. For example, if molten solder is disposed in the flexural resonator and is agitated by the energy traveling along the wall of the flexural resonator, a wire or metal strip disposed in the molten solder will become coated, even in the absence of flux. In a further modification the outer surface of the flexural resonator contacts a porous workpiece which workpiece is dried by the atomization of the fluid absorbed by the workpiece.

A principal object of the present invention, therefore, is the provision of a sonic or ultrasonic processing apparatus exhibiting predetermined regions of increased ultrasonic energy intensity within a fluid medium.

Another principal object of this invention is the provision of an apparatus which amplifies the vibratory motion in predetermined regions of the apparatus.

A further object of this invention is the provision of a tubular flexible resonator for use in a sonic or ultrasonic processing apparatus which can be constructed to exhibit different amplitude vibratory motion at predetermined locations along an axis parallel to the longitudinal axis of the flexural resonator.

Further and still other objects of the present invention will become apparent when the specification is read in conjunction with the accompanying drawings.

DETAILED DESCRIPTION OF THE INVENTION

Figure 1:
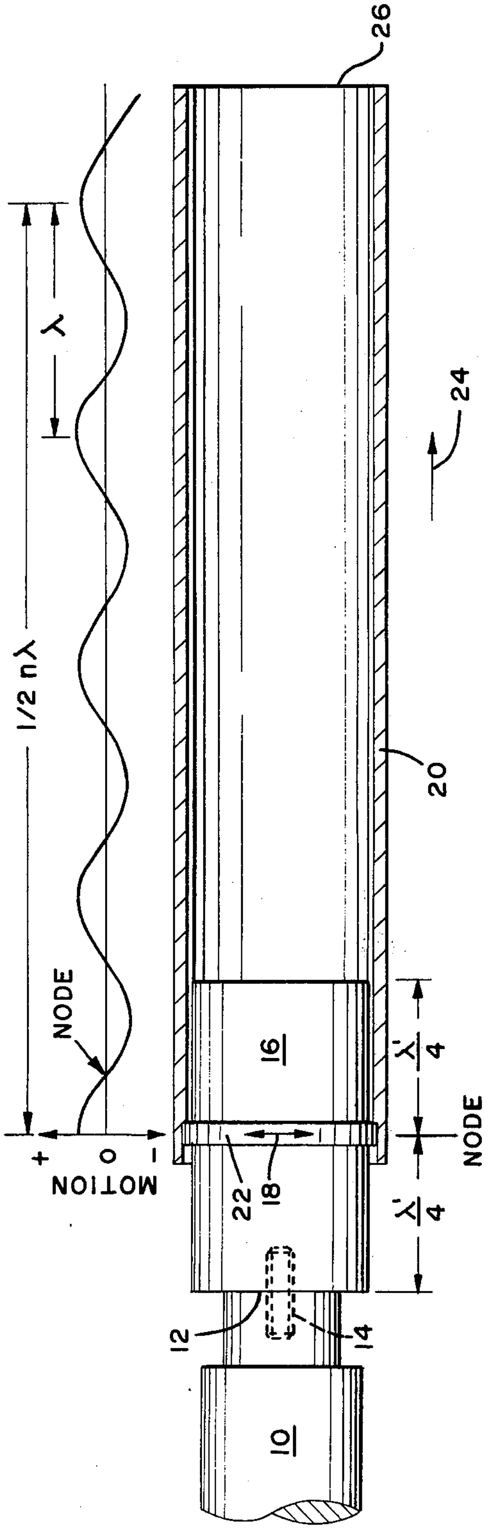
FIG. 1 is an elevational view, partly in section, of an embodiment of the invention.

Referring to the figures and FIG. 1 in particular, an electroacoustic converter 10 is electrically connected to an electrical high frequency energy generator (not shown) which provides electrical energy of a predetermined frequency to the converter 10. The converter 10 transforms the applied electrical energy to mechanical vibrations for rendering the converter 10 resonant along its longitudinal axis. The converter 10 is generally designed to be resonant at a frequency in the range between 1 kHz and 100 kHz. The energy transformation may be accomplished by the use of either piezoelectric or magnetostrictive elements as is well-known in the art. A suitable piezoelectric converter for use in the present apparatus is disclosed in U.S. Pat. No. 3,328,610, dated June 27, 1967, issued to S. E. Jacke entitled "Sonic Wave Generator".

An extensional resonator 16 dimensioned to resonate as a half wavelength resonator at the predetermined frequency at which the converter 10 is driven is coupled via a screw 14 to the radial output surface 12 of the converter 10, such output surface being located at an antinodal region of longitudinal motion. The radial plane through the resonator 16 medially spaced from the ends of the resonator 16 is located at the node of longitudinal motion where substantially all vibratory motion at this plane is in the radial direction as indicated by arrow 18.

One end of a tubular flexural resonator 20 is press fitted coaxially upon a coupling flange 22 extending circumferentially from the resonator 16 at the nodal region. In an alternative embodiment the coupling flange 22 may comprise a removable collar for accommodating tubular resonators having different inner diameters. The radial motion of the resonator 16 existing in the nodal region and shown by arrow 18 is coupled to the flexural resonator 20 through the flange 22 and causes a pattern of radial flexural vibrations traveling along the wall of the flexural resonator 20 in the direction of arrow 24.

The wavelength $\lambda$ of the radial flexural wave is determined by the choice of the tube wall thickness and the tube material. In a typical embodiment an aluminum flexural resonator having a diameter of approximately 2½ inches (63.5 mm) and a wall thickness of one-quarter inch (6.4 mm) is coupled to an extensional resonator 16 which is rendered resonant at a frequency of 20 kHz.

The amplitude of the flexural vibratory motion traveling along resonator 20 in the direction of arrow 24 is determined by the length of the resonator 20, that is, the distance from the point of contact with flange 22 to the free end 26 of the resonator 20 determines the amplitude of the flexural standing waves traveling along the wall of the flexural resonator 20. For example, if the length of the flexural resonator 20 is an integral multiple number of the half wavelengths of the flexural vibratory motion, there is no amplification of the vibratory motion. Therefore, the amplitude of the standing wave pattern along the flexural resonator is the same as the amplitude of the radial motion at the flange 22. By dimensioning the length of the flexural resonator 20 to be other than a multiple of the half wavelength, it is possible to cause the amplitude of the vibratory waves traveling along the flexural resonator 20 to exceed the motion at the flange 22.

Amplification of the flexural motion can also be achieved by reducing the wall thickness at, or near, a flexural motion node as shown in FIGS. 2, 3, 4 and 5. Moreover, the amplitude of the flexural motion can be decreased by increasing the wall thickness in the region of the flexural motion node.

Figure 2:
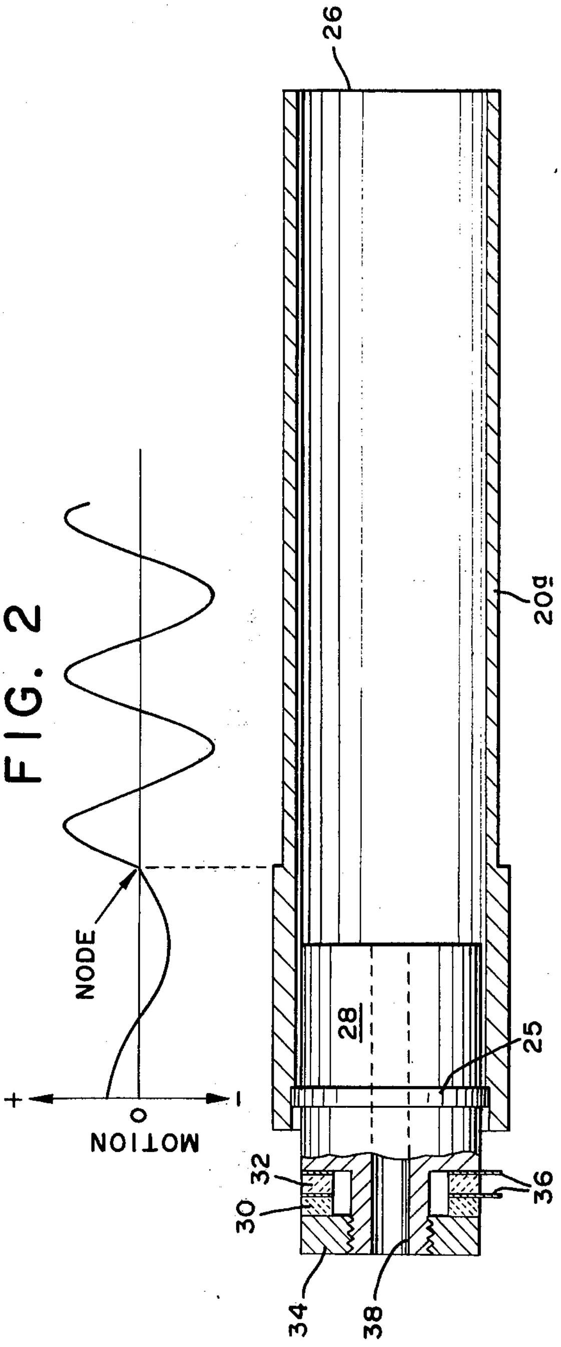
FIG. 2 is an elevational view, partly in section, of an alternative embodiment of the invention.

In FIG. 2, the extensional resonator 28 is constructed for obviating the need for an external driving source, i.e. a converter 10. As shown, the electromechanical conversion means, piezoelectric disks 30 and 32, are incorporated in the resonator construction and are maintained in forced compressional contact with extensional resonator 28 by a threaded nut 34. The electrical energy from the high frequency electrical energy generator (not shown) is connected to the piezoelectric disks via a pair of electrodes 36. The extensional resonator 28 has a centrally disposed bore 38 which is a most useful feature for in-line processing using the present invention. A fluid to be processed is introduced through bore 38 into the vibrating flexural resonator **20*a*. The vibratory energy traveling along the wall of resonator 20*a* agitates the fluid passing through the resonator 20*a* toward the free end 26 of the tube 20*a*. The apparatus described is most useful for emulsification and dispersion of a liquid, as well as for cleaning and tinning of metallic strip and wire. The apparatus comprising resonator 20*a* is a self-contained reservoir of fluid. If the fluid within the resonator 20*a* is molten solder, for example, a metallic wire or strip placed into the open end 26 of the resonator 20*a*** will be coated with the solder even in the absence of flux.

Figure 3:
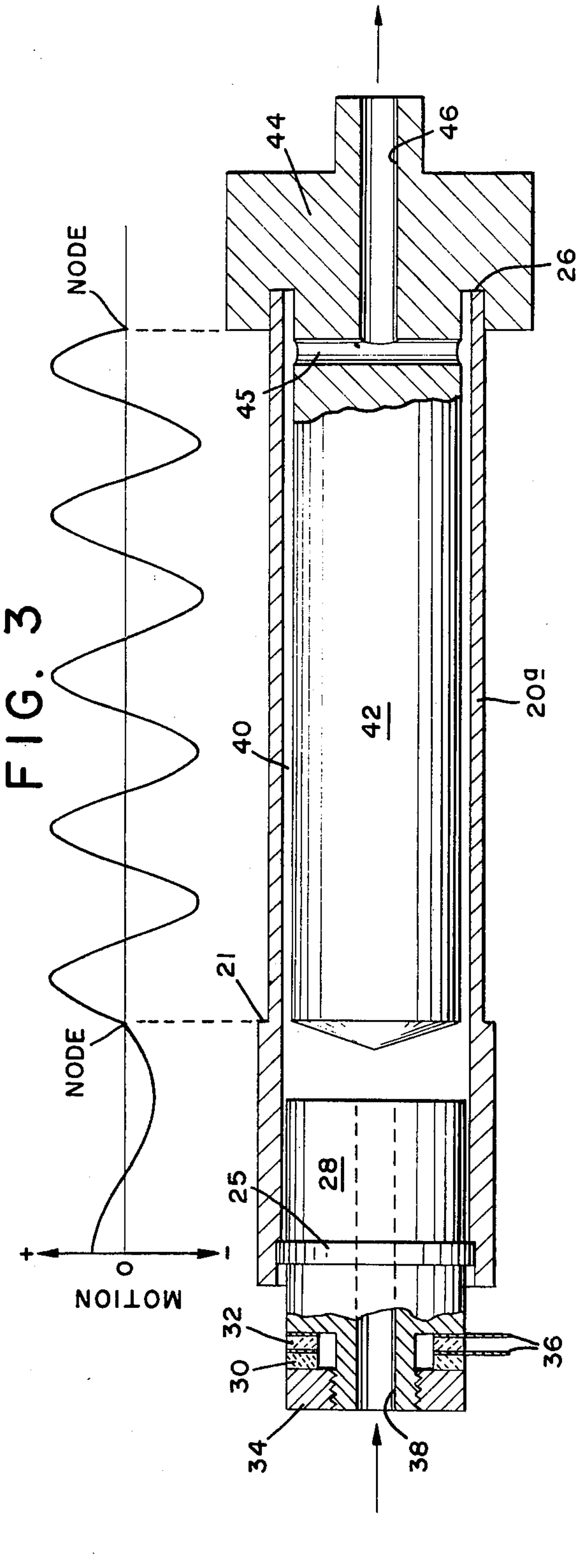
FIG. 3 is an elevational view, in section, of another embodiment of the invention.
Figure 4:
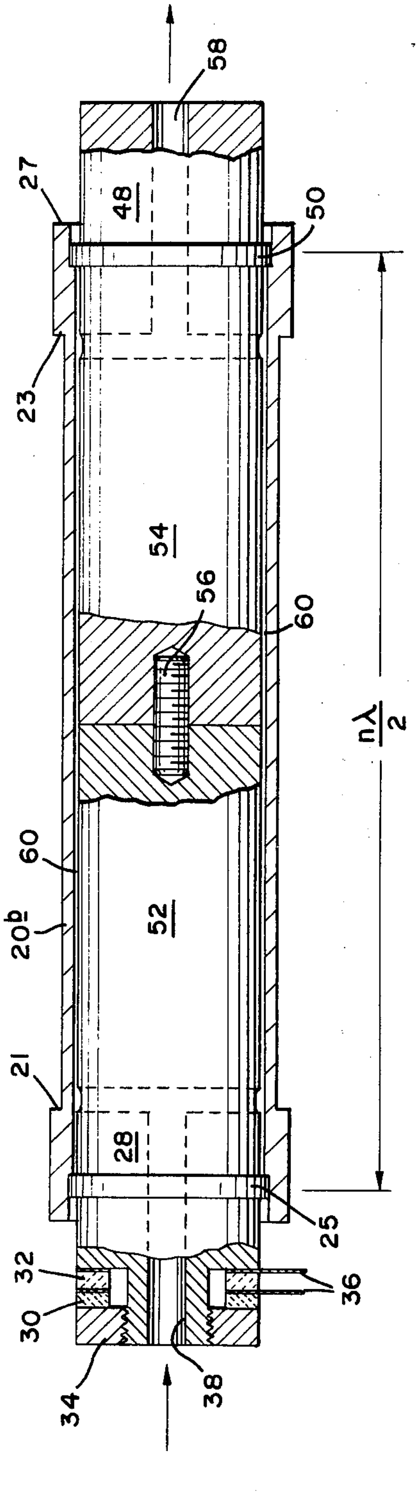
FIG. 4 is an elevational view, in section, of a further embodiment of the invention.

FIGS. 3 and 4 show arrangements for providing annular gaps 40 and 60, respectively, for high intensity processing. The gap 40 (FIG. 3) is disposed between the inside wall of the vibrating flexural resonator **20*a* and a cylindrical metallic core 42 forming a part of a large acoustically dead termination 44. The free end 26 of flexural resonator 20*a* is press fitted into the termination 44 which constitutes a large acoustically dead mass exhibiting minimal ultrasonic motion, thereby causing the right end of the flexural resonator 20*a* to be located at a nodal region of vibratory motion traveling along the resonator 20*a*. A fluid to be processed enters the apparatus via ingress bore 38, spreads radially in gap 40 and passes around core 42 along the gap whereat high intensity ultrasonic energy is manifest. The fluid after being subjected to the high intensity energy in the gap 40 egresses via a radial bore 45 and an axial bore 46 disposed in termination 44**.

To increase the amplitude of the flexural motion and, hence, the intensity of the ultrasonic energy in the region of the gap 40, the wall thickness of the flexural resonator **20*a* is reduced by a step at location 21 which is a flexural motion node of the vibratory energy traveling along the wall of the flexural resonator 20*a***.

In FIG. 4 the output end 27 of the flexural resonator **20*b* is caused to be at an antinodal region of the vibratory motion traveling along the wall of the resonator 20*b*. The flexural resonator 20*b* is supported and driven at both ends by a pair of extensional resonators 28 and 48 disposed at locations so that the distance between the respective contact flanges 25 and 50 is a multiple of the half wavelength of the vibratory motion traveling along the wall of the flexural resonator 20*b*. In the described arrangement both ends of the flexural resonator 20*b* undergo motion in phase. Disposed concentrically in the center of the flexural resonator 20*b* are a pair of cylindrical cores 52 and 54, forming a part of the resonators 28 and 48 respectively, held together by a bolt 56. A fluid flowing into the apparatus through bore 38 around cylindrical cores 52 and 54 and passing through the bore 58 in the resonator 48 is subjected to intense ultrasonic energy in the annular gap 60** surrounding the cylindrical cores.

As described above in conjunction with FIG. 3, the wall thickness of the flexural resonator **20*b* is reduced at flexural motion nodes 21 and 23 for causing an area of increased ultrasonic energy intensity to occur within annular gap 60**.

It should be noted that the resonator 48 is not driven by an external converter, but is rendered resonant by internal piezoelectric means forming part of its resonant structure.

Figure 5:
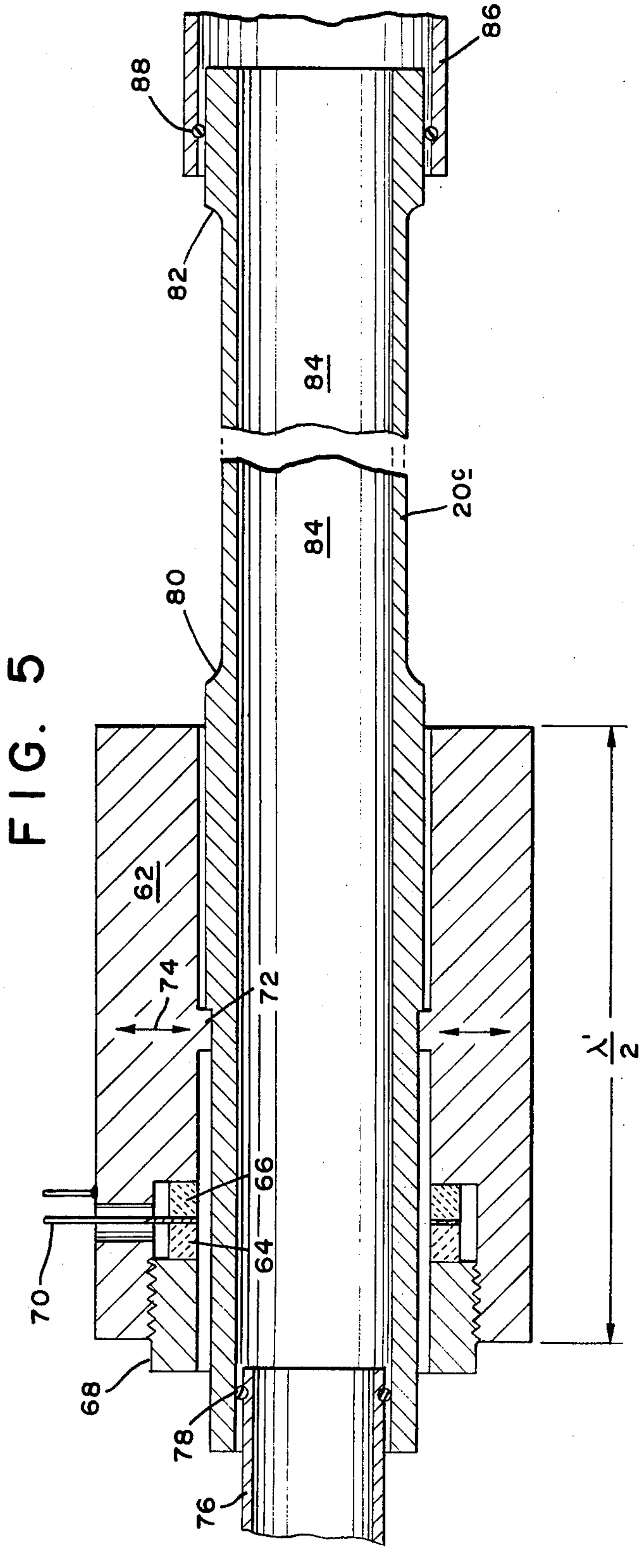
FIG. 5 is an elevational view, in section, of a still further embodiment of the invention.

An alternative embodiment of the apparatus wherein a flexural resonator **20*c* is disposed coaxially within an extensional resonator 62 is shown in FIG. 5. As described in conjunction with FIG. 2, piezoelectric disks 64 and 66 forming a part of the resonator 62 are held in forced compressional contact with the half wavelength extensional resonator 62 by means of a threaded nut 68. The electrical energy is provided to the disks 64 and 66 via electrode 70. The flexural resonator 20*c* is press fitted into a flange 72 medially disposed between the ends of the resonator 62 at a nodal region of longitudinal motion of the resonator 62 for receiving the radially directed (arrow 74) vibratory energy of the resonator 62**.

Moreover, fluid to be processed enters the flexural resonator 20c via an ingress conduit 76 having an outer diameter smaller than the inner diameter of the flexural resonator 20c. The ingress conduit 76 is coupled to the flexural resonator 20c by an O-ring gasket 78 disposed at a nodal region of vibratory motion of the flexural resonator 20c.

The wall thickness of the flexural resonator 20c is reduced at flexural motion nodes 80 and 82 for causing an increase of the flexural vibratory motion amplitude traveling along the wall of resonator 20c and a resultant region of increased ultrasonic agitation 84 within the fluid disposed in the flexural resonator 20c. The fluid after being processed within the apparatus passes into an egress conduit 86 having an inner diameter greater than the outer diameter of the flexural resonator 20c. The egress conduit is coupled to the flexural resonator 20c by a further O-ring gasket 88 also disposed at a nodal region of the vibratory motion of the flexural resonator 20c.

By properly dimensioning the diameter of the flexural resonator 20c, a focussing effect of the vibratory energy at the center region of the flexural resonator 20c is possible. The focussing effect allows high intensity cavitation of the fluid while causing less wear of the resonator inner wall contacting the fluid.

Figure 6:
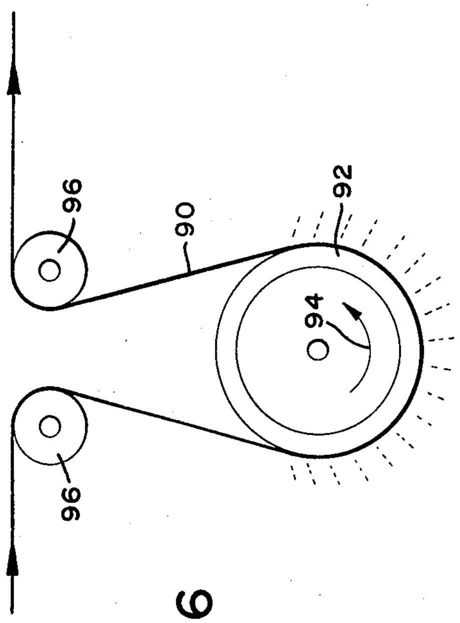
FIG. 6 is a plan view of another preferred embodiment of the present invention.

While the apparatus described above generally involves processing within the flexural resonator, it will be apparent to those skilled in the art that the external surface of the flexural resonator can also be used in a processing apparatus. FIG. 6 shows a typical application for drying wet sheet material or other porous workpieces by ultrasonic atomization. The wet sheet material 90 is wrapped partially around the vibrating flexural resonator 92. The liquid absorbed by the sheet material 90 upon contacting the resonator 92 is atomized by the action of the radially directed vibratory energy waves traveling along the walls of resonator 90 in a direction perpendicular to the plane of the drawing, thereby drying the material 90 as the sheet material 90 is conveyed over the resonator 92 in the direction of arrow 94 by the action of a pair of feed rollers 96.

While several embodiments of a sonic or ultrasonic processing apparatus employing a flexural resonator have been described and illustrated, it will be apparent to those skilled in the art that many further variations and modifications may be made without deviating from the broad principle of the invention which shall be limited only by the scope of the appended claims.

What is claimed is:

1. A sonic processing apparatus comprising:

a first resonator dimensioned to be resonant in a direction along its longitudinal axis when energized with high frequency vibratory energy, and a second resonator coaxially coupled to said first resonator substantially at a nodal region of axial vibratory motion of said first resonator for receiving said vibratory energy and being dimensioned for transmitting the energy as radial flexural waves longitudinally along the wall of said second resonator.

2. A sonic processing apparatus as set forth in claim 1, said second resonator being tubular and having a length which is a multiple number of half wavelengths of said radial flexural waves.

3. A sonic processing apparatus as set forth in claim 1, said second resonator being tubular and having a non-uniform wall thickness for creating regions of increased high frequency vibratory energy in a fluid in contact with said second resonator.

4. A sonic processing apparatus as set forth in claim 3, said second resonator having a change in wall thickness disposed substantially at a flexural vibratory motion node.

5. A sonic processing apparatus as set forth in claim 1, and converter means coupled to said first resonator for providing vibratory energy to said first resonator at a predetermined frequency.

6. A sonic processing apparatus as set forth in claim 5, said first resonator comprising electromechanical energy conversion means.

7. A sonic processing apparatus as set forth in claim 1, said first resonator having a bore therethrough substantially coaxial with said second resonator for passing fluid through said first and said second resonators.

8. A sonic processing apparatus as set forth in claim 1, said second resonator having a central core for causing a fluid to pass through an annular gap between said core and the wall of said second resonator.

9. A sonic processing apparatus as set forth in claim 8, and means disposed for terminating said second resonator in an acoustically dead mass, said termination being at a nodal region of said radial flexural waves.

10. A sonic processing apparatus as set forth in claim 8, and a third resonator coupled to said second resonator at a location an integral number of half wavelengths from the coupling location of said first to said second resonator for causing both ends of said second resonator to be disposed at antinodal regions of vibratory motion.

11. A sonic apparatus as set forth in claim 1, said first resonator having a coupling flange at a nodal region of vibratory motion, and said second resonator being in forced contact with said coupling flange for converting said radially directed axial vibratory energy from said first resonator to radial flexural vibration in said second resonator.

12. A sonic processing apparatus as set forth in claim 11, said second resonator having one end portion disposed within said first resonator for coupling said vibratory energy from said first resonator to said second resonator.

* * * * *